US008821638B2

(12) United States Patent
Tamagaki et al.

(10) Patent No.: US 8,821,638 B2
(45) Date of Patent: Sep. 2, 2014

(54) CONTINUOUS DEPOSITION APPARATUS

(75) Inventors: Hiroshi Tamagaki, Takasago (JP);
Toshiki Segawa, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 700 days.

(21) Appl. No.: 13/060,224

(22) PCT Filed: Aug. 21, 2009

(86) PCT No.: PCT/JP2009/064610
§ 371 (c)(1),
(2), (4) Date: Feb. 22, 2011

(87) PCT Pub. No.: WO2010/024187
PCT Pub. Date: Mar. 4, 2010

(65) Prior Publication Data
US 2011/0139072 A1   Jun. 16, 2011

(30) Foreign Application Priority Data

Aug. 27, 2008   (JP) .................................. 2008-217805

(51) Int. Cl.
*C23C 16/00* (2006.01)
*C23C 14/00* (2006.01)
*C23C 14/24* (2006.01)
*C23C 14/56* (2006.01)

(52) U.S. Cl.
CPC ............... *C23C 14/24* (2013.01); *C23C 14/562* (2013.01)
USPC ................. 118/718; 204/298.24; 204/298.26; 118/726; 118/733

(58) Field of Classification Search
USPC ...................................... 118/718; 204/298.24
See application file for complete search history.

(56) References Cited

U.S. PATENT DOCUMENTS 4,014,779 A  *  3/1977  Kuehnle ................... 204/298.08
4,692,233 A  *  9/1987  Casey ...................... 204/298.25
(Continued)

FOREIGN PATENT DOCUMENTS

JP        44-8330       4/1969
JP       62 230983     10/1987
(Continued)

OTHER PUBLICATIONS

International Search Report issued Oct. 20, 2009 in PCT/JP09/064610 filed Aug. 21, 2009.
(Continued)

*Primary Examiner* — Gordon R Baldwin
*Assistant Examiner* — Charlee Bennett
(74) *Attorney, Agent, or Firm* — Oblon, Spivak, McClelland, Maier & Neustadt, L.L.P.

(57) ABSTRACT

Provided is a continuous deposition apparatus wherein replacement operations of a feeding unit and a take-up unit are easily performed. The continuous deposition apparatus is provided with: a vacuum chamber (1); a deposition roller (2); evaporation sources (7L1, 7L2, 7R) which supply a deposition material to a film substrate from the side of the film substrate which is wound on the deposition roller and on which a coating is to be deposited; a feeding unit (3) which supplies the film substrate to the deposition roller (2); and a take-up unit (4) which takes up the film substrate after the coating is deposited thereon. The vacuum chamber (1) is provided with: an evaporation source opening for carrying out and carrying in the evaporation sources; evaporation source door sections (16L, 16R) which open and close the evaporation source opening; another opening provided for the substrate on which the coating is to be deposited, besides the evaporation source opening, for the purpose of carrying out and carrying in the feeding unit (3) and the take-up unit (4); and door sections (17L, 17R) which are provided for the substrate and open and close the opening provided for the substrate.

7 Claims, 7 Drawing Sheets

(56) References Cited

U.S. PATENT DOCUMENTS

| | | | |
|---|---|---|---|
| 6,132,516 A * | 10/2000 | Hayashi et al. | 118/718 |
| 6,338,872 B1 * | 1/2002 | Yoshino et al. | 427/248.1 |
| 7,594,970 B2 * | 9/2009 | Hein et al. | 118/718 |
| 2006/0024428 A1 | 2/2006 | Cho | |
| 2007/0107781 A1 | 5/2007 | Hein | |

FOREIGN PATENT DOCUMENTS

| | | |
|---|---|---|
| JP | 5 320881 | 12/1993 |
| JP | 5-320903 | 12/1993 |
| JP | 5 320903 | 12/1993 |
| JP | 2000-178717 | 6/2000 |
| JP | 2000178717 A * | 6/2000 |
| JP | 2001-303249 | 10/2001 |
| JP | 2001 303249 | 10/2001 |
| JP | 2006 77284 | 3/2006 |
| JP | 2007-211295 | 8/2007 |
| JP | 2008-31492 | 2/2008 |
| JP | 2008 31492 | 2/2008 |
| KR | 10-2009-0034193 | 4/2009 |
| WO | WO 03/038142 A1 | 5/2003 |
| WO | 2008 096510 | 8/2008 |

OTHER PUBLICATIONS

U.S. Appl. No. 13/393,382, filed Feb. 29, 2012, Segawa, et al.
Extended European Search Report issued Apr. 27, 2012, in Patent Application No. 09809838.7.
Communication pursuant to Article 94(3) EPC issued Oct. 4, 2012, in Patent Application No. 09 809 838.7 1215.
Notice of Preliminary Rejection issued Dec. 4, 2012 in Korean Patent Application No. 10-2011-7004529 (with English translation).
Notification of Reason(s) for Refusal issued Dec. 12, 2012 in Japanese Patent Application No. 2008-217805 (with English translation).
Korean Office Action Issued Jul. 12, 2012 in Patent Application No. 10-2011-7004529 (with English translation).

* cited by examiner

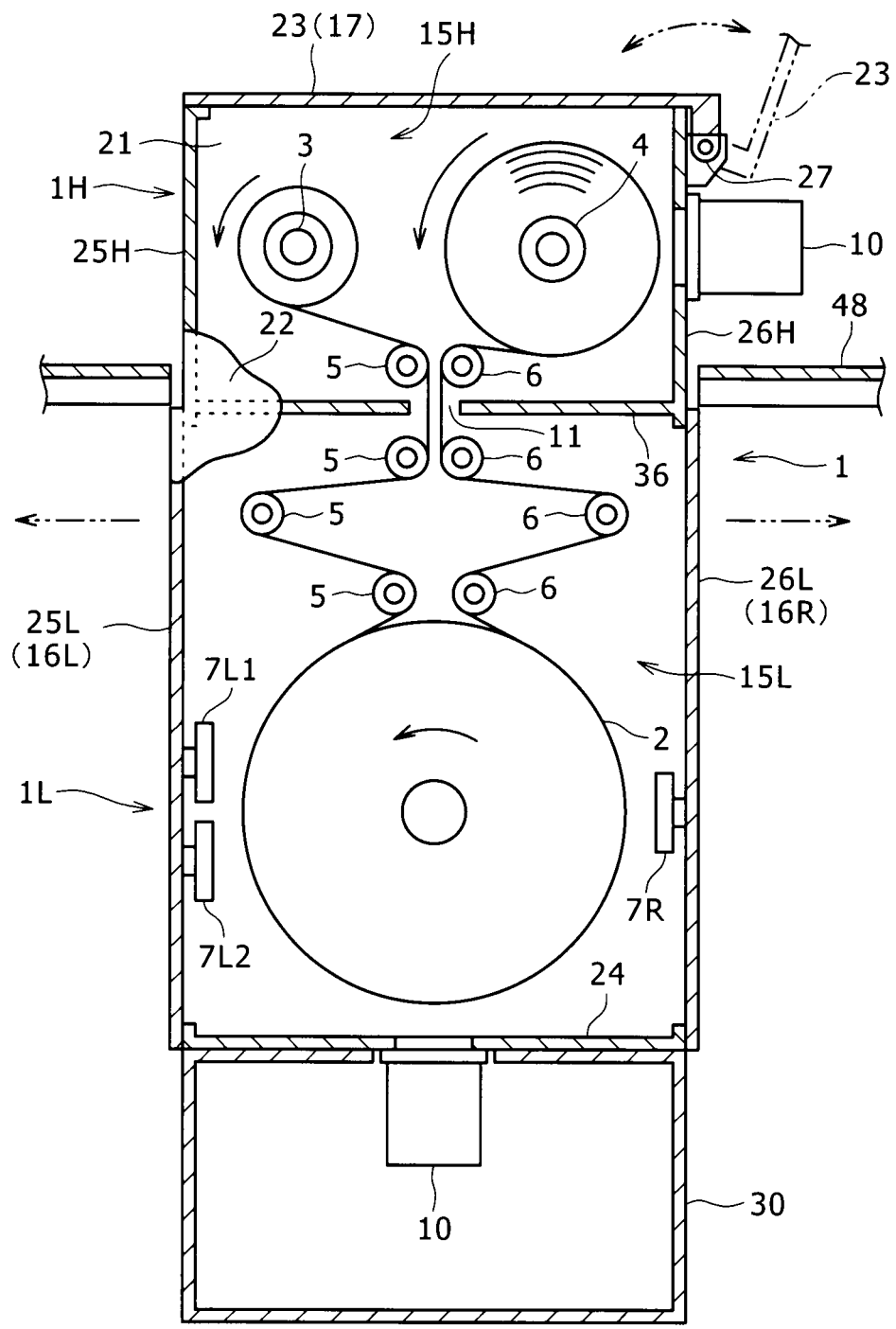

CONTINUOUS DEPOSITION APPARATUS

TECHNICAL FIELD

The present invention relates to a continuous deposition apparatus having a deposition roller around which a film substrate on which a coating is to be deposited is wound, for continuously depositing a thin coating such as a functional thin coating on a surface of the substrate conveyed by this deposition roller.

BACKGROUND ART

Conventionally, as a continuous deposition apparatus for continuously depositing a thin coating on a surface of a film substrate on which the coating is to be deposited, the film substrate being formed by a long film or sheet made of plastic or an inorganic matter, there is an apparatus provided with a vacuum chamber, means for continuously conveying the film substrate in this vacuum chamber, and means for depositing various functional thin coatings on a surface of the film substrate to be conveyed by sputtering or vapor deposition. In the continuous deposition apparatus of this type, there is a need for performing maintenance and arrangement operations such as replacement of an evaporation source such as a sputtering source, replacement and cleaning of a mask partitioning a film formation area, and replacement and feeding of the material for each batch processing.

In recent years, there are variously proposed continuous deposition apparatuses in which the above operations are easily performed and only small space is required for installation. For example, Patent Documents 1 and 2 describe a continuous deposition apparatus including a vacuum chamber and evaporation sources of a deposition material, wherein the vacuum chamber has a chamber main body and side walls, the side walls are openable relative to the chamber main body as side door sections, and the evaporation sources are attached to the side walls.

As shown in FIGS. 5 and 6, this continuous deposition apparatus is provided with a vacuum chamber 101 installed on a lower frame 30, evaporation sources 7L, 7R provided in this vacuum chamber 101.

The vacuum chamber 101 is formed by a chamber main body 15, and side walls 25, 26. The chamber main body 15 has a back wall 21, a front wall 22 arranged so as to face this, and an upper wall 23 and a lower wall 24 respectively coupling upper ends and lower ends of the back wall 21 and the front wall 22, and forms a frame shape with left and right openings. The side walls 25, 26 form left and right evaporation source door sections 16L, 16R for openably closing the left and right openings of the chamber main body 15. These evaporation source door sections 16L, 16R are respectively openably coupled to the chamber main body 15 by hinge mechanisms 27 provided in side ends of the back wall 21, so as to seal the chamber main body 15 when closed.

In the vacuum chamber 101, a partition wall plate 41 roughly dividing the inside thereof into the upper and lower sides is provided. A deposition roller 2 is rotatably provided in a lower part in the vacuum chamber 101. A film serving as a substrate on which a coating is to be deposited is wound around this deposition roller 2, and this film is conveyed at fixed speed by rotation of the deposition roller 2.

Meanwhile, in an upper part in the vacuum chamber 101, a feeding unit 3 and a take-up unit 4 are provided, and in addition, a plurality of guide rollers 5 and a plurality of guide rollers 6 are respectively rotatably provided. The guide rollers 5 convey the film substrate before the coating is deposited thereon fed out from the feeding unit 3 to the side of the deposition roller 2, and the guide rollers 6 convey the film substrate after the coating is deposited thereon from the deposition roller 2 to the side of the take-up unit 4.

In the lower part in the vacuum chamber 101, in addition to the deposition roller 2, the evaporation sources 7L, 7R are provided so as to be positioned on the left and right sides of the deposition roller 2. An exhaust pump 10 for evacuating the upper part in this vacuum chamber 101 is provided in the upper part of the vacuum chamber 101. In general, a tension measurement mechanism provided with a measurement element such as a load cell is additionally provided in part of the guide rollers 5, 6.

The feeding unit 3 and the take-up unit 4 respectively have rotation shafts and cores provided detachably on the rotation shafts, the cores around which the film substrate is wound. Meanwhile, rotation drive sections detachably and rotatably supporting the rotation shafts are provided in the back wall 21 and the front wall 22. The deposition roller 2 and the guide rollers 5, 6 are rotatably supported by the back wall 21 and the front wall 22. The evaporation sources 7L, 7R are detachably attached to the side walls 25, 26, that is, the side door sections 16L, 16R.

At the time of starting deposition operation, while the film substrate before the coating is deposited thereon is fully wound around the core of the feeding unit 3 into a coil shape, the core of the take-up unit 4 is blank and the film substrate after the coating is deposited thereon is not yet wound around the core. After the inside of the vacuum chamber 101 is pumped down to a vacuum state, the film wound around the core of the feeding unit 3 is continuously supplied to the deposition roller 2 via the guide rollers 5. After the coating is deposited on an outer peripheral surface of the deposition roller 2, the film is again taken up by the core provided in the take-up unit 4 via the guide rollers 6 on the side of the take-up unit. At this time, the tension measurement mechanism additionally provided in the guide roller detects tension of the film substrate. The detected value is fed back to the rotation drive sections, so that torque of the rotation shafts of the feeding unit and the take-up unit are controlled. Thereby, predetermined tension is applied to the film substrate.

After the deposition operation is finished, the left and right evaporation source door sections 16L, 16R are opened, and the evaporation sources 7L, 7R additionally provided in these evaporation source door sections 16L, 16R are pulled out of the chamber. In this state, maintenance and replacement of the evaporation sources 7L, 7R are performed. The blank feeding unit 3 and the fully wound take-up unit 4 are carried out from the evaporation source door sections, and new units are carried in instead of these. Such carrying operations of the feeding unit 3 and the take-up unit 4 are called as unit replacement operations in this specification.

The evaporation source door sections of the vacuum chamber 101 are not necessarily the side walls 25, 26 but may be formed by left and right divided sections for example divided from a center part of the vacuum chamber 101 as shown in FIG. 7, for example. Specifically, the vacuum chamber 101 shown in FIG. 7 is divided into a left divided section 34L, a center divided section 33, and a right divided section 34R, and the left divided section 34L and the right divided section 34R respectively form the left and right evaporation source door sections 16L, 16R. The center divided section 33 and the left divided section 34L are divided from each other by a first division surface 31 passing through one side end of the back wall 21, one side part of the front wall 22, the upper wall 23, and the lower wall 24. The center divided section 33 and the right divided section 34R are divided from each other by a second division surface 32 passing through the other side end of the back wall 21, the other side part of the front wall 22, the upper wall 23, and the lower wall 24.

In the vacuum chamber 101 of this type, since areas of openings opened and closed by the evaporation source door sections are large, workability of the maintenance and the like is more improved. The continuous deposition apparatus shown in FIG. 7 and the continuous deposition apparatus shown in FIGS. 5 and 6 are collectively called as a continuous deposition apparatus of a both-side opening type.

The continuous deposition apparatus of the both-side opening type is excellent in space efficiency and a maintenance property. However, it is sometimes difficult to perform the unit replacement operations of carrying the feeding unit and the take-up unit out of and into the vacuum chamber 101 at the time of supplying the substrate such as the film and collecting the film substrate after the coating is deposited thereon. Specifically, the unit replacement operations are performed through the side openings opened by opening the evaporation source door sections. However, since the feeding unit or the take-up unit is provided in the upper part of the vacuum chamber, the replacement operations of bringing these units out and in through the side openings are sometimes not easily performed.

It is thought that for the unit replacement operations, the feeding unit and the take-up unit are arranged so as to be pulled out from the vacuum chamber in the parallel direction to the rotation shafts thereof. However, in order to pull out the units in the axial direction in such a way, there is a need for ensuring wide space for pulling out rolls of the units at a high position in the upper part of the vacuum chamber in which the units are arranged. It is also difficult to pull out and install the rolls from and into the vacuum chamber at high place.

RELATED ART DOCUMENT

Patent Document

Patent Document 1: Japanese Patent Laid-Open No. 2006-77284
Patent Document 2: Japanese Patent Laid-Open No. 2008-31492

SUMMARY OF THE INVENTION

An object of the present invention is to provide a continuous deposition apparatus for easily performing replacement operations of a feeding unit and a take-up unit for conveying a film substrate on which a coating is to be deposited. The continuous deposition apparatus according to the present invention includes a vacuum chamber, a deposition roller rotatably provided in the vacuum chamber, the deposition roller around which the film substrate is wound, an evaporation source of deposition material for supplying and depositing the deposition material onto the film substrate wound around the deposition roller, a feeding unit rotatably arranged on the upper side of the deposition roller in the vacuum chamber, the feeding unit for supplying the film substrate to the deposition roller, and a take-up unit rotatably arranged on the upper side of the deposition roller in the vacuum chamber, the take-up unit for taking up the film substrate after the coating is deposited thereon. The vacuum chamber has an evaporation source opening for carrying the evaporation source out of and into the vacuum chamber, an evaporation source door section for opening and closing the evaporation source opening, an opening for the substrate provided at a separate position from the evaporation source opening, the opening for the substrate for carrying the feeding unit and the take-up unit out of and into the vacuum chamber, and a door section for the substrate provided separately from the evaporation source door section, the door section for the substrate for opening and closing the opening for the substrate. Due to the opening for the substrate and the door section for the substrate, there is no need for carrying the feeding unit and the take-up unit through the evaporation source opening unlike the conventional example, so that the unit replacement operations are easily performed.

BRIEF DESCRIPTION OF THE DRAWINGS

FIG. 3 A front sectional view of a continuous deposition apparatus according to a second embodiment of the present invention.

BEST MODES FOR CARRYING OUT THE INVENTION

Figure 5:
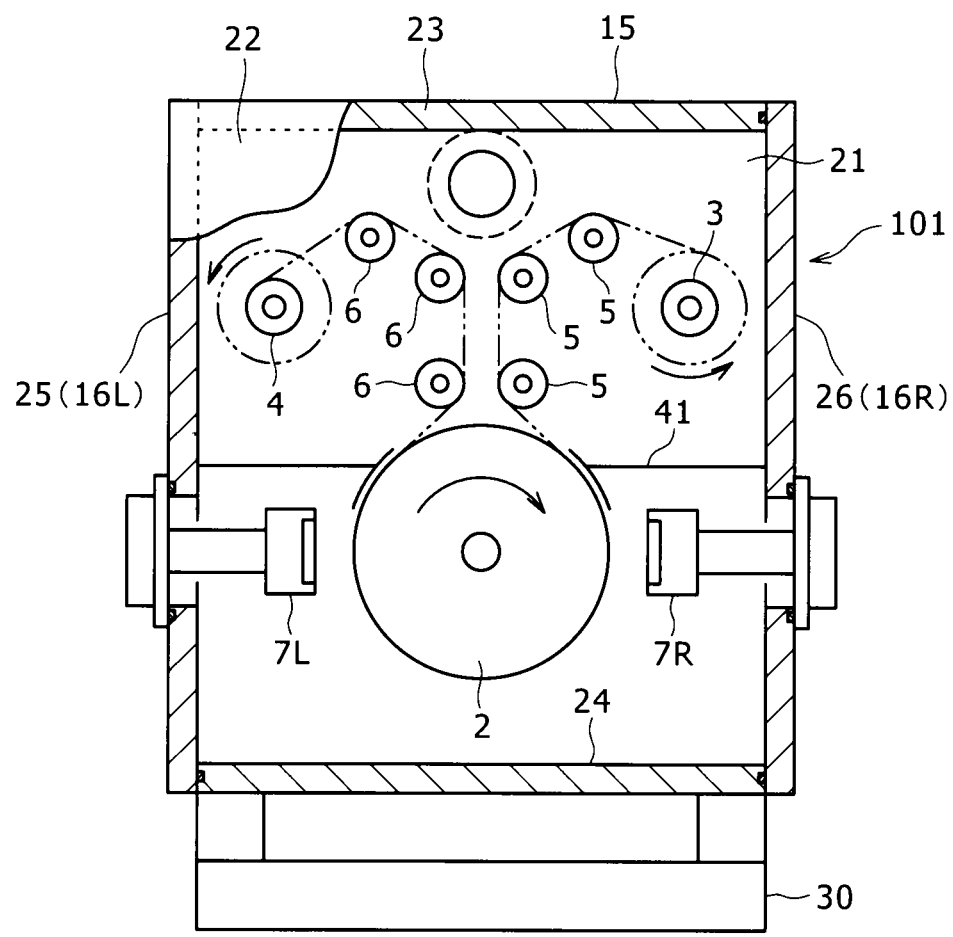
FIG. 5 A front sectional view of a conventional continuous deposition apparatus.
Figure 6:
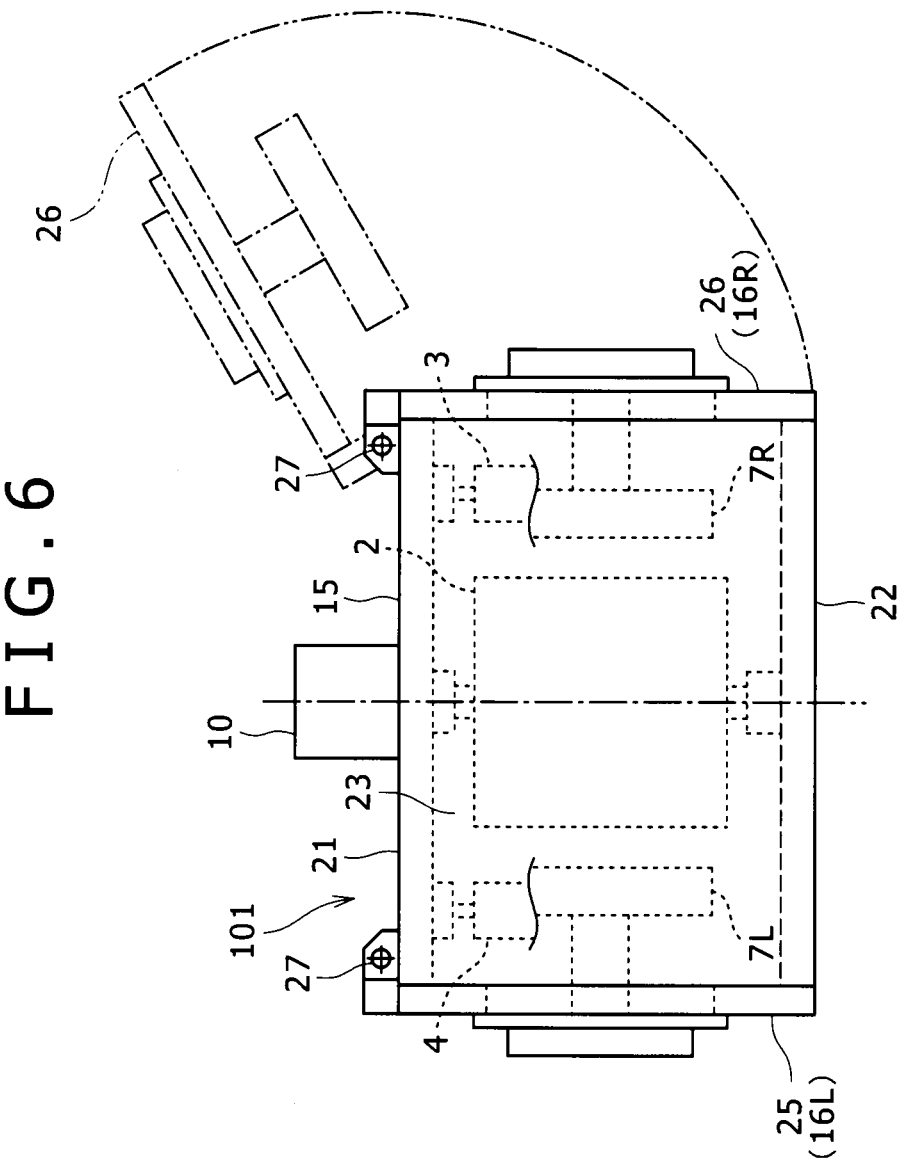
FIG. 6 A plan view of the continuous deposition apparatus of FIG. 5.
Figure 7:
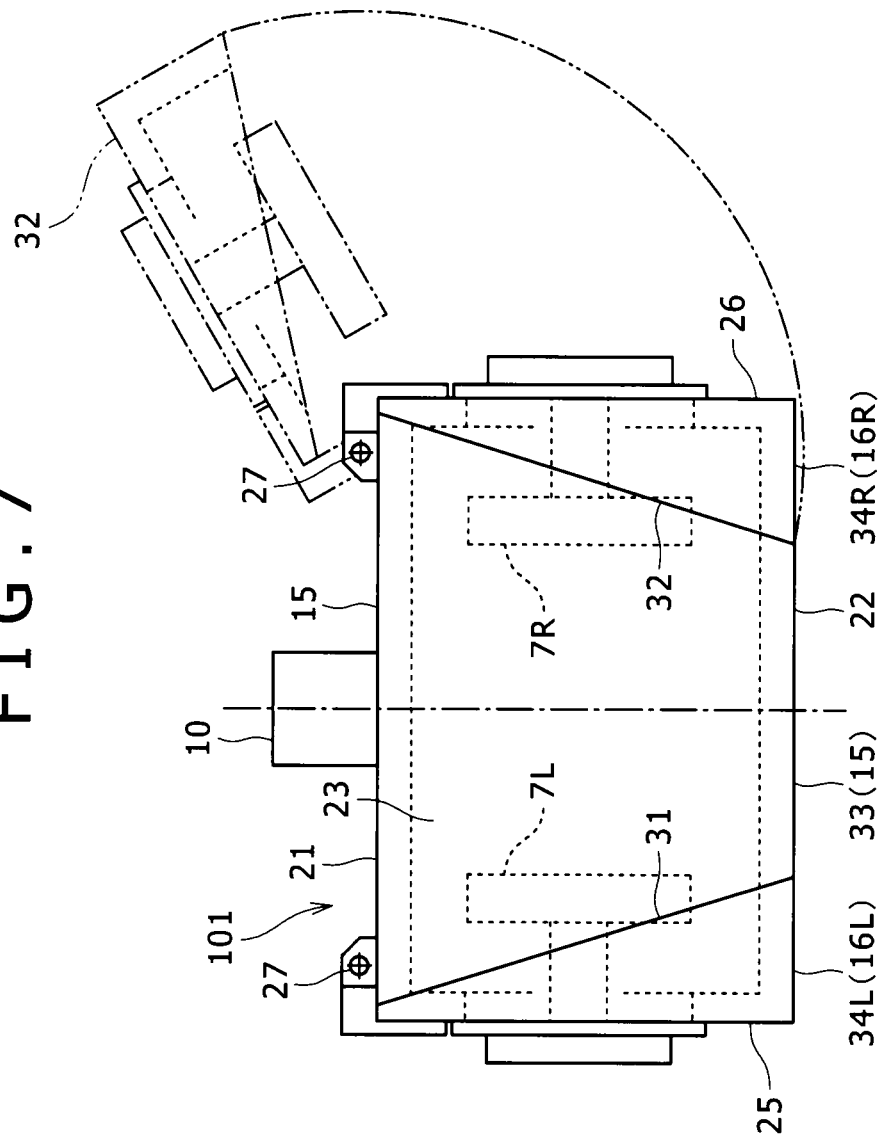
FIG. 7 A plan view of another conventional continuous deposition apparatus.

Hereinafter, a continuous deposition apparatus according to a first embodiment of the present invention will be described with reference to FIG. 1. It should be noted that constituent elements which are common to constituent elements of the conventional continuous deposition apparatuses shown in FIGS. 5 to 7 will be given the same reference numerals, and description thereof will be omitted or simplified. Thus, parts different from the conventional apparatuses will be mainly described.

Figure 1:
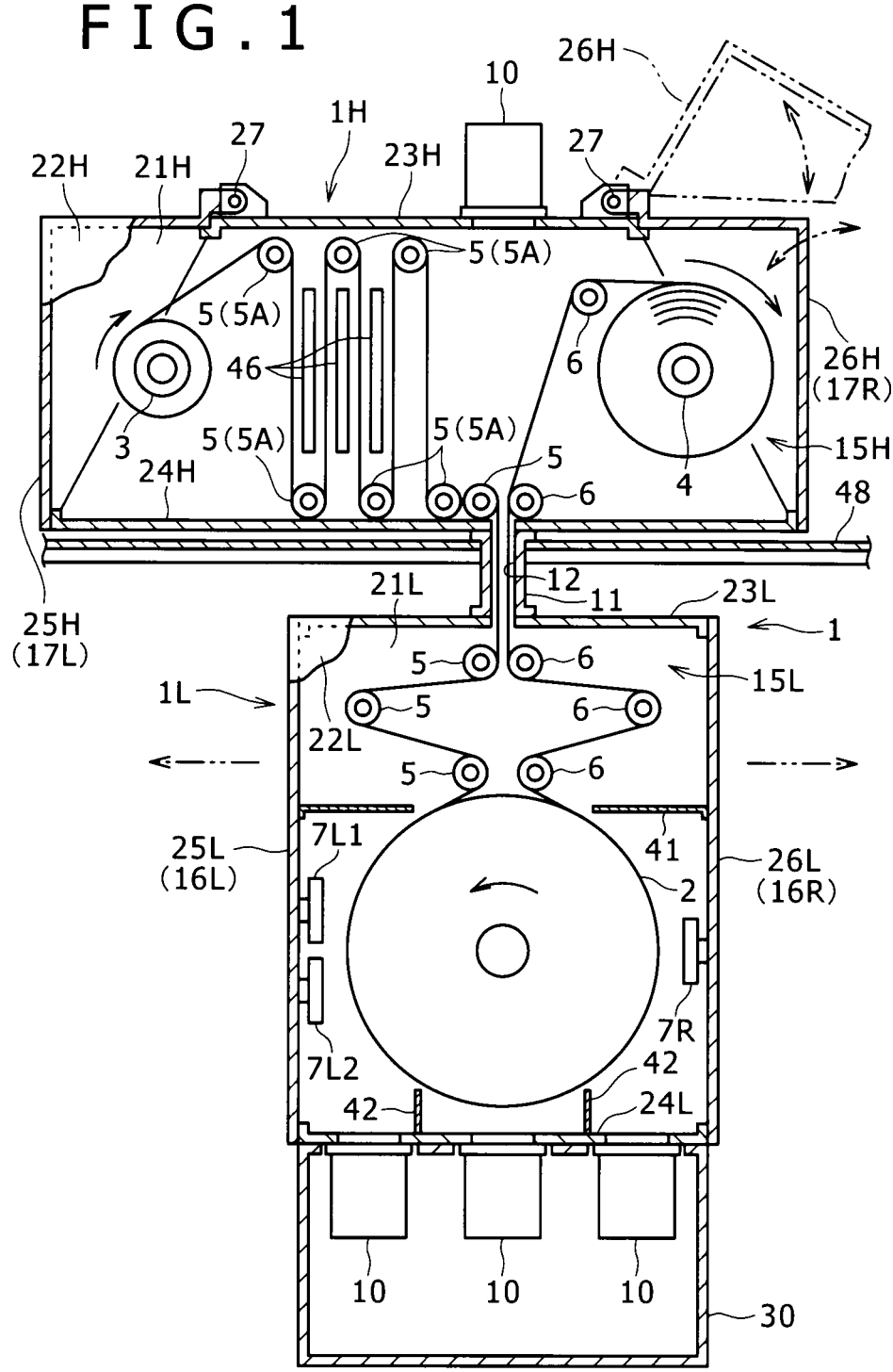
FIG. 1 A front sectional view of a continuous deposition apparatus according to a first embodiment of the present invention.

The continuous deposition apparatus according to this embodiment is provided with a vacuum chamber 1 as shown in FIG. 1. This vacuum chamber 1 is installed on a lower frame 30, and provided with an upper chamber 1H and a lower chamber 1L positioned on its lower side. These chambers 1H, 1L are connected to each other via an atmosphere separating section 11 forming a conveyance passage 12 for conveying a film substrate F on which a coating is to be deposited.

A feeding unit 3 and a take-up unit 4 are provided in the upper chamber 1H. These units 3, 4 are respectively provided with rotation shafts which are rotatable and detachable in the up and down direction from rotation drive sections provided on the side of the chamber. A plurality of guide rollers 5 and a plurality of guide rollers 6 are provided in the lower chamber 1L. The guide rollers 5 convey the film substrate F fed out from the feeding unit 3 in the upper chamber 1H to the side of the lower chamber 1L through the conveyance passage 12 of the atmosphere separating section 11. The guide rollers 6 guide the film substrate F on which the coating is deposited in the lower chamber 1L to the take-up unit 4 in the upper chamber 1H through the conveyance passage 12. An exhaust pump 10 is additionally provided in the upper chamber 1H. This exhaust pump 10 is attached to a center part of an upper wall 23H forming the upper chamber 1H.

Outgassing means is further provided in the upper chamber 1H. This outgassing means is to facilitate removal of a gas component (mainly water vapor) adhered on the film substrate F when the film substrate F fed out from the feeding unit 3 is being conveyed to the lower chamber 1L, and has guide rollers 5A for conveying the film substrate F fed out from the feeding unit 3 in a zigzag way in the up and down direction, and a plurality of heaters 46 arranged so as to be adjacent to the film substrate F between the materials F being conveyed in a zigzag way in the up and down direction. It should be noted that the guide rollers 5A for conveying the film substrate F in a zigzag way are not necessarily provided and at least one heater is only required.

The upper chamber 1H has an upper chamber main body 15H, and door sections 17L, 17R for the substrate provided on its both left and right sides. At positions of the upper chamber main body 15H on the both left and right sides, openings for the substrate for carrying the feeding unit 3 and the take-up unit 4 into the upper chamber 1H and out of the upper chamber 1H are formed. The door sections 17L, 17R for the substrate are arranged so as to respectively open and close the openings for the substrate.

The door sections 17L, 17R for the substrate are respectively formed by left and right side parts of the upper wall 23H, left and right triangle side parts of a back wall 21H and a front wall 22H, and left and right side walls 25H, 26H. The upper chamber main body 15H is formed by center parts of the back wall 21H and the front wall 22H of the upper chamber 1H, a center part of the upper wall 23H, and the lower wall 24H, so as to form a trapezoid shape seen from the front side. Upper inner ends of the door sections 17L, 17R for the substrate are respectively coupled to this upper chamber main body 15H via hinge mechanisms 27 so as to be pivotable around horizontal axes, that is, openable. When the door sections 17L, 17R for the substrate are placed at close positions, the upper chamber main body 15H is sealed.

In the example in the figure, the feeding unit 3 is arranged on the left side of the upper chamber 1H, and the take-up unit 4 is arranged on the right side. Thus, by opening and closing the door section 17L, 17R for the substrate on the left side or the right side, the feeding unit 3 or the take-up unit 4 can be easily replaced. The door sections 17L, 17R for the substrate include the left and right side parts of the upper wall. Thus, by opening the door sections 17L, 17R for the substrate, parts on the obliquely upper sides of the feeding unit 3 and the take-up unit 4 can be respectively widely opened. Thereby, these units can be attached to and detached from the rotation drive sections from the parts on the obliquely upper sides. That is, unit replacement operations can be easily performed.

This continuous deposition apparatus is further provided with an operation deck 48. This operation deck 48 is provided between the upper chamber 1H and the lower chamber 1L so that an operation of taking from the upper chamber 1H and an operation of mounting to the upper chamber 1H of the feeding unit 3 and the take-up unit 4 are easily performed. The operation deck 48 according to this embodiment is provided in the vicinity of a lower surface of the upper chamber 1H so as to widely cover an area in a periphery of the lower chamber 1L. Therefore, the operation deck 48 divides the atmosphere on the upper and lower sides, so that the atmosphere in the area in the periphery of the lower chamber 1L can be prevented from influencing the upper side of the operation deck 48.

Thereby, a cleanliness level of an area on the upper side of the operation deck 48 can be maintained to be high, and contamination of the film substrate F due to dust generation in accordance with maintenance or the like of evaporation sources performed in an area on the lower side of the operation deck 48 at the time of the unit replacement operations can be suppressed or prevented.

In the lower chamber 1L, a partition wall plate 41 partitioning the inside thereof into an upper compartment and a lower compartment is provided. A deposition roller 2 is rotatably provided in the lower compartment, and a plurality of the guide rollers 5 and a plurality of the guide rollers 6 are provided in the upper compartment. The guide rollers 5 supply the film substrate F conveyed from the upper chamber 1H to the deposition roller 2, and the guide rollers 6 convey the film substrate F after the coating is deposited thereon from the deposition roller 2 to the side of the upper chamber 1H. A plurality of the guide rollers 6 is rotatably provided.

A tension measurement mechanism for measuring tension of the film substrate F can be additionally provided in part of the guide rollers 5, 6. The tension of the film substrate F to be conveyed can be controlled based on the measured tension. According to need, a mechanism for performing pre-treatment before the coating is deposited on the film substrate F, a mechanism for performing post-treatment of the film substrate F after the coating is deposited thereon, or various measurement devices for measuring characteristics of the film substrate F can be provided in the lower chamber 1L.

Evaporation sources 7L1, 7L2, 7R are accommodated in the lower compartment. Among the evaporation sources, the evaporation sources 7L1, 7L2 are attached to an inner side surface of a left side wall 25L of the lower chamber 1L so as to be positioned on the left side of the deposition roller 2. The evaporation source 7R is attached to an inner side surface of the right side wall 26L of the lower chamber 1L so as to be positioned on the right side of the deposition roller 2.

In this embodiment, the left side wall 25L and the right side wall 26L respectively form a left evaporation source door section 16L and a right evaporation source door section 16R. Meanwhile, a back wall 21L, a front wall 22L, an upper wall 23L, and a lower wall 24L of the lower chamber 1L form a square-tubular lower chamber main body 15L opening on the left and right sides. The left side wall 25L and the right side wall 26L are coupled to the lower chamber main body 15L so as to respectively open and close left and right openings, that is, evaporation source openings. By closing both the side walls 25L, 26L, the lower chamber 1L is sealed. In this structure, at the time of a maintenance operation and a replacement operation of the evaporation sources 7L1, 7L2, 7R, only by opening the evaporation source door sections 16L, 16R, the evaporation sources 7L1, 7L2, 7R can be taken out to the outside of the chamber, so that the operations are easily performed.

However, the evaporation sources according to the present invention are not necessarily attached to the side walls 25L, 26L but may be provided in a lower wall 24L, for example. Mechanisms for enabling opening and closing operations of the evaporation source door sections 16L, 16R and the door sections 17L, 17R for the substrate are not limited to the hinge mechanisms but may be parallel movement mechanisms, for example. The evaporation source door sections according to the present invention are not limited to the door sections of opening and closing the entire surfaces of the side walls unlike the present embodiment but may be door sections of opening and closing part of the side walls.

Among the evaporation sources according to this embodiment, the two evaporation sources 7L1, 7L2 provided on the left side of the deposition roller 2 are DMS (dual magnetron sputter) evaporation sources, and the evaporation source 7R on the right side is a DC sputter source. However, the evaporation sources according to the present invention are not limited to this example but can be appropriately selected from, for example, a RF sputter source, a rotary magnetron sputter source, an arc evaporation source, a plasma CVD deposition mechanism, and the like.

In addition to the partition wall plate 41, two left and right partition wall plates 42 are uprightly provided on the lower side of the deposition roller 2 in the lower chamber 1L. These partition wall plates 42 are so high that upper ends thereof are close to an outer peripheral surface of the deposition roller 2 so as to divide three areas provided in line in the left and right direction. Three exhaust pumps 10 are arranged so as to respectively independently exhaust the divided areas. These exhaust pumps 10 are attached to the lower wall 24L so as to protrude into the lower frame 30, and exhaust the circumference of the evaporation sources independently from each other and separately from an exhaust mechanism (not shown) for the entire lower chamber 1L so as to improve deposition quality. These exhaust pumps 10 and the partition wall plates 41, 42 may be appropriately omitted and the entire lower chamber 1L may be evacuated by a single exhaust system.

The atmosphere separating section 11 connects the lower chamber 1L and the upper chamber 1H and forms the conveyance passage 12 allowing passage of the film substrates F before and after the coating is deposited thereon inside thereof. This conveyance passage 12 has a much smaller transverse section than a transverse section (a section seen from the upper side) of the lower chamber 1L and extends in the up and down direction so as to separate atmosphere gas between the upper chamber 1H and the lower chamber 1L. Thereby, gas such as water vapor generated at the time of feeding out the film substrate F from the feeding unit 3 and heating in the upper chamber 1H can be suppressed from flowing into the lower chamber 1L, so that the deposition quality at the time of deposition treatment in the lower chamber 1L can be improved.

In this apparatus, only when the atmosphere separating section 11 forms the conveyance passage 12 having a small transverse section, the circulation of the atmosphere between the upper and lower chambers is suppressed. However, more preferably, a sealing mechanism 13 for substantially completely shutting off the circulation of the atmosphere in the conveyance passage 12 is further provided. Even when the door sections 17L, 17R for the substrate are opened for attaching and detaching the feeding unit 3 and the take-up unit 4 before and after deposition operation and thus the upper chamber 1H is exposed to the outside air, this sealing mechanism 13 can maintain the atmosphere in the lower chamber 1L at reduced pressure. Thereby, absorption of gas of the outside air to an inner wall of the chamber due to exposure of the inside of the lower chamber 1L to the outside air can be suppressed or prevented, so that the deposition quality can be stabilized.

Figure 2A:
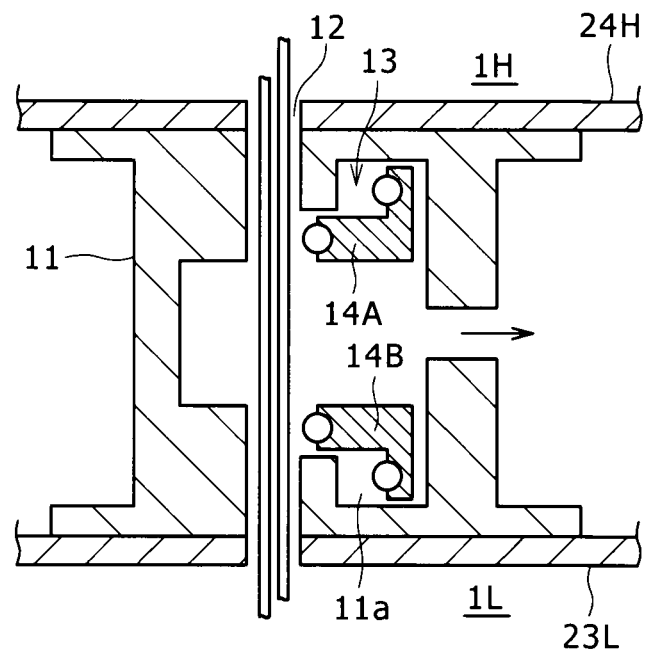
FIG. 2 (*a*) A sectional view of an atmosphere separating section included in the continuous deposition apparatus showing a state before a sealing mechanism thereof is operated; and (*b*) a sectional view of the atmosphere separating section showing a state after the sealing mechanism thereof is operated.
Figure 2B:
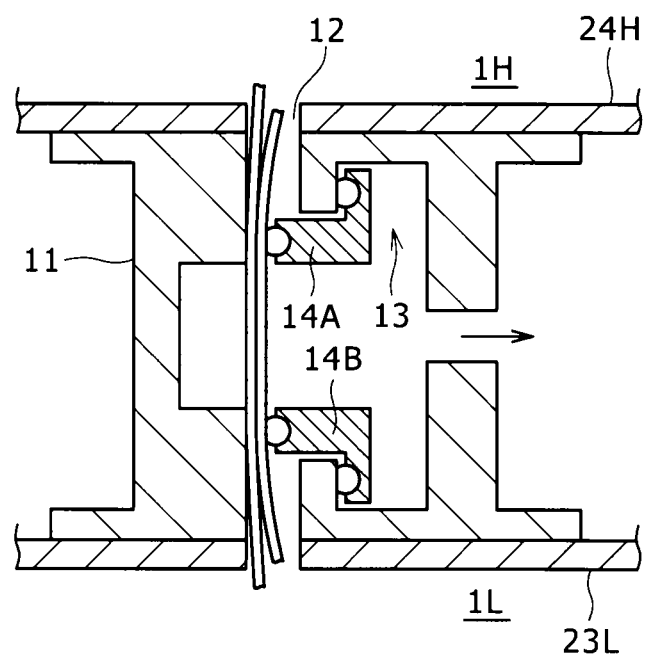

FIG. 2 shows one example of the sealing mechanism 13. This sealing mechanism 13 is provided with a pair of upper and lower shut-off valves 14A, 14B. Sealing materials made of rubber or the like are attached to proper points of the shut-off valves 14A, 14B. Meanwhile, a valve chamber 11a adjacent to the conveyance passage 12 is formed in the atmosphere separating section 11, and both the shut-off valves 14A, 14B are stored in this valve chamber 11a. These shut-off valves 14A, 14B are respectively driven by cylinders or other drive mechanisms (not shown) so as to go back and forth between a shut-off position shown in FIG. 2(b) and a withdrawal position shown in FIG. 2(a).

These shut-off valves 14A, 14B are switched to the shut-off position at the time of stopping the conveyance of the film substrate F. By pressing the film substrates F before and after the coating is deposited thereon leftward in the figure onto an inner side surface surrounding the conveyance passage 12 in a state that these film substrates are overlapped with each other, the film substrates F are nipped with the inner side surface so that upper space of the shut-off valve 14A and lower space of the shut-off valve 14B are isolated from each other (that is, sealing is made by shutting off the conveyance passage 12 into the upper and lower sides). Meanwhile, the shut-off valves 14A, 14B go back to the withdrawal position during the conveyance of the film substrate F so as to allow movement of the film substrate F.

It should be noted that since the shut-off valves 14A, 14B at the shut-off position only nip the film substrates F with the inner side surface of the conveyance passage 12, the sealing is sometimes not perfect. Therefore, more preferably, space between the upper shut-off valve 14A and the lower shut-off valve 14B is supplementarily pumped (for example in the direction shown by a rightward arrow in FIG. 2) by a supplementary evacuation mechanism.

In the present embodiment, the atmosphere separating section 11 connecting the upper chamber 1H and the lower chamber 1L is only provided at one point. However, the atmosphere separating section according to the present invention may be formed by a first atmosphere separating section forming a first conveyance passage for conveying the film substrate F before the coating is deposited thereon, and a second atmosphere separating section forming a second conveyance passage for conveying the film substrate F after the coating is deposited thereon independently from the first conveyance passage. Further, a first sealing mechanism for shutting off the circulation of the atmosphere in the first conveyance passage in a state that the film substrate F before the coating is deposited thereon is inserted into the first conveyance passage, and a second sealing mechanism for shutting off the circulation of the atmosphere in the second conveyance passage in a state that the film substrate F after the coating is deposited thereon is inserted into the second conveyance passage may be provided.

Working of the continuous deposition apparatus according to this embodiment will be described in order. The upper chamber 1H and the lower chamber 1L forming the vacuum chamber 1 are respectively evacuated. The film substrate F is fed out and conveyed from the feeding unit 3 detachably accommodated in the upper chamber 1H. The heaters 46 heat the film substrate F during the conveyance, and thereby, the efficiently separated gas component is pumped by the vacuum pump 10 (outgassing treatment is performed). The film substrate F after the outgassing treatment is continuously supplied to the deposition roller 2 while being guided by the guide rollers 5. Deposition materials evaporated from the left and right evaporation sources 7L1, 7L2, 7R are deposited on a surface of the film substrate F on the outer peripheral surface of this deposition roller 2, and thereby the coating is deposited. The film substrate F after the coating is deposited thereon is returned from the deposition roller 2 to the upper chamber 1H via the guide rollers 6 on the carrying-out side and taken up by the take-up unit 4 detachably accommodated in this upper chamber 1H.

When the film substrate F after the coating is deposited thereon is taken up by the take-up unit 4, the inside of the vacuum chamber 1 is returned to atmosphere pressure. The evaporation source door sections 16L, 16R of the lower chamber 1L are opened, and the evaporation sources 7L1, 7L2, 7R are pulled out from the lower chamber 1L, so that the maintenance thereof is performed. Meanwhile, the door sections 17L, 17R for the substrate are opened in the upper chamber 1H, and the blank feeding unit 3 after feeding out all the film substrate F and the take-up unit 4 around which the film substrate F after the coating is deposited thereon is fully wound are taken out. A feeding unit 3 around which an unprocessed film substrate F is fully wound and a blank take-up unit 4 around which no film substrate F is wound are set in the upper chamber 1H.

These operations are easily performed through the openings for the substrate opened and closed by the door sections 17L, 17R for the substrate provided near the units 3, 4. Due to the operation deck 48, the replacement operations can be easily performed without being influenced by the dust generation in accordance with the maintenance of the evaporation sources.

In a case where this apparatus is provided with the sealing mechanism 13, the deposition operation is stopped before the film substrate F of the feeding unit 3 is completely fed out. By driving the shut-off valves 14A, 14B of the sealing mechanism 13 at the shut-off position while maintaining the lower chamber 1L at the reduced pressure, the film substrates F before and after the coating is deposited thereon are pressed onto the inner side surface of the atmosphere separating section 11 surrounding the conveyance passage 12 so that the upper space and the lower space are isolated from each other, while only the upper chamber 1H is exposed to the outside air.

The film substrates F before and after the coating is deposited thereon nipped between the shut-off valves 14A, 14b and the inner side surface in the conveyance passage 12 are cut off on the side of the upper chamber 1H. After the units are replaced, the film substrate F before the coating is deposited thereon among the film substrates F nipped in the conveyance passage 12 is coupled to the film substrate F fed out from the feeding unit 3, while the an end of the film substrate F after the coating is deposited thereon nipped in the conveyance passage 12 is attached to a blank core of the take-up unit 4. After that, the upper chamber 1H is evacuated and the operation is started again.

Next, a continuous deposition apparatus according to a second embodiment of the present invention will be described. It should be noted that constituent elements which are common to the continuous deposition apparatus of the first embodiment will be given the same reference numerals, and description thereof will be omitted or simplified. Thus, different parts will be mainly described.

The continuous deposition apparatus according to the second embodiment is provided with the vacuum chamber 1 as shown in FIG. 3. This vacuum chamber 1 is installed on the lower frame 30 and formed by the upper chamber 1H and the lower chamber 1L as well as the vacuum chamber 1 according to the first embodiment. However, a back wall 21 and a front wall 22 forming the upper chamber 1H and the lower chamber 1L are respectively formed by single members which are continuous over the entire areas in the up and down direction. An isolation wall 36 is provided in a part at about two third of overall height of both the walls 21, 22 so as to divide the vacuum chamber 1 into the upper chamber 1H and the lower chamber 1L.

The atmosphere separating section 11 is provided in a center part of the isolation wall 36. This atmosphere separating section 11 surrounds a conveyance hole passing through the isolation wall 36 so as to allow the conveyance of the film substrates F before and after the coating is deposited thereon. This atmosphere separating section 11 may have a tubular main body surrounding the conveyance passage as well as the first embodiment.

The apparatus according to the second embodiment is also provided with the operation deck 48. This operation deck 48 is provided in the circumference of a lower part of the upper chamber 1H so as to cover the area in the periphery of the lower chamber 1L.

This apparatus is also provided with the deposition roller 2, the feeding unit 3, the take-up unit 4, a plurality of the guide rollers 5, a plurality of the guide rollers 6, and the evaporation sources 7L1, 7L2, 7R. Both the units 3, 4 are detachably and rotatably provided in the upper chamber 1H. The guide rollers 5 are rotatably provided in the lower chamber 1L so as to guide the film substrate F before the coating is deposited thereon to the side of the lower chamber 1L. The guide rollers 6 are rotatably provided in the lower chamber 1L so as to guide the film substrate F after the coating is deposited thereon from the lower chamber 1L to the side of the take-up unit 4.

The deposition roller 2 is rotatably provided in the lower chamber 1L. Among the evaporation sources 7L1, 7L2, 7R, the two evaporation sources 7L1, 7L2 corresponding to the DMS sources are provided at positions on the right side of the deposition roller 2, and the evaporation source 7R corresponding to the DC sputter evaporation source is provided at a position on the left side of the deposition roller 2. As well as the first embodiment, other evaporation sources may be used instead of the evaporation sources 7L1, 7L2, 7R in accordance with a deposition method.

As well as the first embodiment, the tension measurement mechanism may be provided in any of the guide rollers 5, 6 so that rotation control of the feeding unit 3 and the take-up unit 4 is performed based on measurement results thereof.

The lower chamber 1L has the lower chamber main body 15L. This lower chamber main body 15L is formed by the isolation wall 36, a part of the back wall 21 on the lower side of the isolation wall 36, a part of the front wall 22 on the lower side of the isolation wall 36, and a lower wall 24, and the evaporation source openings are formed on the both left and right sides of the main body. Further, the lower chamber 1L has the left and right side walls 25L, 26L, and these walls form the left and right evaporation source door sections 16L, 16R for respectively opening and closing the evaporation source openings. The evaporation sources 7L1, 7L2 on the left side are attached to the inner side surface of the left evaporation source door section 16L, and the evaporation source 7R on the right side is attached to the inner side surface of the right evaporation source door section 16R. Therefore, the evaporation sources 7L1, 7L2, 7R respectively go out of and into the lower chamber 1L in accordance with opening and closing of the left and right evaporation source door sections 16L, 16R.

The upper chamber 1H has the upper chamber main body 15H. This upper chamber main body 15H is formed by the isolation wall 36, a part of the back wall 21 on the upper side of the isolation wall 36, a part of the front wall 22 on the upper side of the isolation wall 36, and the side walls 25H, 26H, and an upward opening for the substrate is formed. Further, this upper chamber 1H is provided with an upper wall 23, and this upper wall 23 is pivotably coupled to the side wall 26H by the hinge mechanism 27 so as to form a door section 17 for the substrate for opening and closing the opening for the substrate and to seal the upper chamber 1H at a closed position.

The partition wall plate 42 according to the first embodiment is not provided in the lower chamber 1L according to the second embodiment, and the inside of the lower chamber 1L is single space. Thus, only one exhaust pump 10 is provided in this lower chamber 1L. Similarly, one exhaust pump 10 is also provided in the upper chamber 1H. However, in the present invention, the number of the exhaust pump is not limited but can be set according to need.

In the second embodiment, the upper wall 23 of the upper chamber 1H forms the door section 17 for the substrate for opening and closing the upward opening for the substrate. Thus, by opening this door section 17 for the substrate, the operations of carrying the feeding unit 3 and the take-up unit 4 out of and into the upper chamber 1H before and after the deposition operation are simply performed with using an overhead crane or the like. Due to the operation deck 48, not only the replacement operations of the feeding unit 3 and the take-up unit 4 are further easily performed but also the contamination of upper space of the operation deck due to dusty atmosphere generated at the time of the maintenance of the evaporation sources can be prevented. In other words, at the time of the unit replacement operations, the contamination of the film substrate F can be prevented. Further, in this embodiment, the back wall 21 and the front wall 22 are shared by the upper chamber 1H and the lower chamber 1L forming the vacuum chamber. Thus, the number of parts of the apparatus is reduced, manufacturing is easily performed, and manufacturing cost is reduced.

A continuous deposition apparatus according to a third embodiment with a further simplified apparatus structure will be described. It should be noted that constituent elements which are common to the continuous deposition apparatus of the other embodiments will be given the same reference numerals, and description thereof will be omitted or simplified. Thus, different parts will be mainly described.

Figure 4:
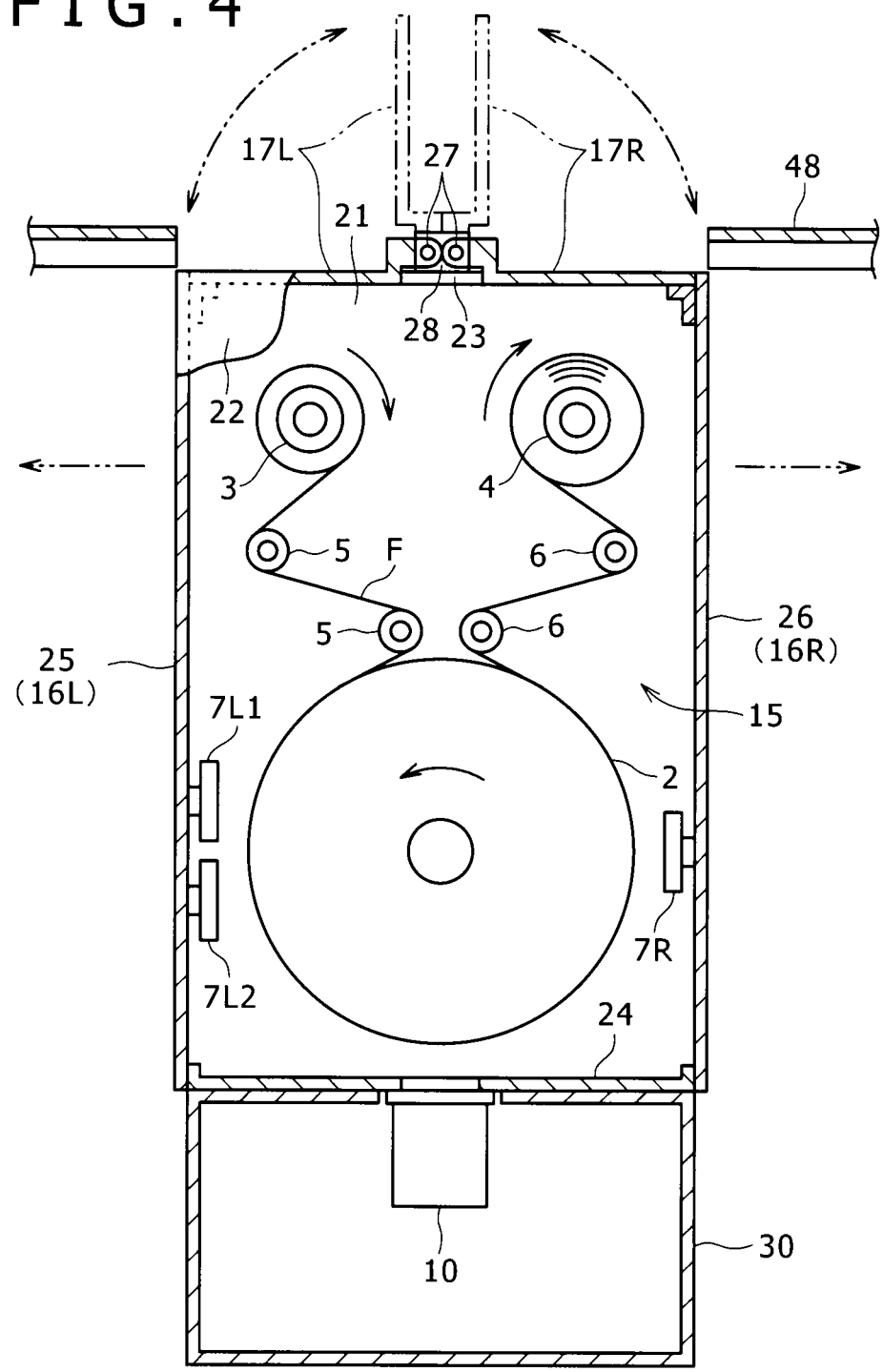
FIG. 4 A front sectional view of a continuous deposition apparatus according to a third embodiment of the present invention.

The continuous deposition apparatus of the third embodiment is provided with the vacuum chamber 1 as shown in FIG. 4, the deposition roller 2, the feeding unit 3, the take-up unit 4, a plurality of the guide rollers 5, a plurality of the guide rollers 6, and the evaporation sources 7L1, 7L2, 7R.

The vacuum chamber 1 has a chamber main body 15, and left and right side walls 25, 26. The inside of this vacuum chamber 1 is not divided by an isolation wall unlike the second embodiment.

The chamber main body 15 is formed by the back wall 21, the front wall 22, the upper wall 23, and the lower wall 24, and the evaporation source openings are formed on the left and right sides of the main body. The side walls 25, 26 are coupled to the chamber main body 15 by the hinge mechanisms so as to form the left and right evaporation source door sections 16L, 16R for respectively opening and closing the evaporation source openings and to seal the vacuum chamber 1 at closed positions thereof.

The left and right openings for the substrate are formed in the upper wall 23, and the left and right door sections 17L, 17R for the substrate are provided so as to respectively open and close these openings. Specifically, a center support member 28 protruding upward at a position between the openings for the substrate is provided in the upper wall 23, and the door sections 17L, 17R for the substrate are attached to this through the hinge mechanisms. These door sections 17L, 17R for the substrate seal the vacuum chamber 1 at closed positions thereof.

The apparatus according to this embodiment is also provided with the operation deck 48. This operation deck 48 is provided in the vicinity of upper ends of the evaporation source door sections 16L, 16R so as to cover an area in a periphery of the vacuum chamber 1.

The feeding unit 3 and the take-up unit 4 are detachably and rotatably provided in an upper part in the vacuum chamber 1, the guide rollers 5, 6 are rotatably provided in a middle part in the vacuum chamber 1, and the deposition roller 2 is rotatably provided in a lower part in the vacuum chamber 1. Among the evaporation sources, the two evaporation sources 7L1, 7L2 are attached to the inner side surface of the left evaporation source door section 16L so as to be positioned on the left side of the deposition roller 2, and the evaporation source 7R is attached to the inner side surface of the right evaporation source door section 16R so as to be positioned on the right side of the deposition roller 2. These evaporation sources 7L1, 7L2, 7R respectively go out of and into the chamber in accordance with the opening and the closing of the evaporation source door sections 16L, 16R.

This apparatus is provided with the single exhaust pump 10. This exhaust pump 10 is attached to the lower wall 24 of the vacuum chamber 1 so as to protrude into the lower frame 30.

In this embodiment, the left and right openings for the substrate and the door sections 17L, 17R for the substrate for opening and closing these openings are provided in the upper wall 23 of the vacuum chamber 1, and the feeding unit 3 and the take-up unit 4 are arranged immediately below the door sections. Thus, in a state that the door sections 17L, 17R for the substrate are opened, the feeding unit 3 can be easily carried through the left opening for the substrate and the take-up unit 4 can be easily carried through the right opening for the substrate into and out of the vacuum chamber 1 before and after the deposition operation with using the overhead crane or the like. Due to the operation deck 48, not only the replacement operations of the feeding unit 3 and the take-up unit 4 are easily performed but also the film substrate F is suppressed from being exposed to the dusty atmosphere in accordance with the maintenance of the evaporation sources on the lower side by dividing the atmosphere on the upper and lower sides in the vicinity of the upper ends of the evaporation source door sections 16L, 16R. Thereby, the deposition quality can be stabilized and improved.

Further, with the vacuum chamber 1 according to this embodiment, the replacement operations can be easily performed with an extremely simple structure that the door sections 17L, 17R for the substrate are only provided in an upper wall of a conventional vacuum chamber. It should be noted that the openings for the substrate and the door sections for the substrate according to the present invention are not limited to the openings and the door sections provided on the left and right sides of the upper wall 23 as shown in FIG. 4 but the entire upper wall may form a single door section for the substrate as shown in FIG. 3.

In the above embodiments, the side walls 25L, 26L of the lower chamber 1L or the side walls 25, 26 of the vacuum chamber 1 form the evaporation source door sections 16L, 16R. However, as a vacuum chamber 101 shown in FIG. 7, left and right divided sections may form the evaporation source door sections.

As described above, the present invention is to provide the continuous deposition apparatus for easily performing the replacement operations of the feeding unit and the take-up unit for conveying the film substrate. This continuous deposition apparatus includes the vacuum chamber, the deposition roller rotatably provided in this vacuum chamber, the deposition roller around which the film substrate is wound, the evaporation sources of the deposition materials for supplying and depositing the deposition materials onto the film substrate wound around the deposition roller, the feeding unit rotatably arranged on the upper side of the deposition roller in the vacuum chamber, the feeding unit for supplying the film substrate to the deposition roller, and the take-up unit rotatably arranged on the upper side of the deposition roller in the vacuum chamber, the take-up unit for taking up the film substrate after the coating is deposited thereon. The vacuum chamber has the evaporation source openings for carrying the evaporation sources out of and into this vacuum chamber, the evaporation source door sections for opening and closing the evaporation source openings, the openings for the film substrate provided at separate positions from the evaporation source openings, the openings for the substrate for carrying the feeding unit and the take-up unit out of and into the vacuum chamber, and the door sections for the substrate provided separately from the evaporation source door sections, the door sections for the substrate for opening and closing the openings for the substrate. Due to the openings for the substrate and the door sections for the substrate, there is no need for carrying the feeding unit and the take-up unit through the evaporation source openings unlike the conventional example. Thereby, the unit replacement operations are easily performed.

The vacuum chamber may be formed by the upper chamber accommodating the feeding unit and the take-up unit, and the lower chamber accommodating the deposition roller and the evaporation sources. In that case, the openings for the substrate and the door sections for the substrate may be provided in the upper chamber, and the openings for the evaporation source and the evaporation source door sections may be provided in the lower chamber. In such a way, due to the openings for the substrate and the door sections for the substrate provided in the upper chamber, the feeding unit and the take-up unit accommodated in the upper chamber can be easily replaced through the openings for the substrate.

More preferably, the continuous deposition apparatus according to the present invention further includes the operation deck where carrying operations of the feeding unit and the take-up unit are performed through the openings for the substrate, and this operation deck is provided on the upper side of the evaporation source door sections so as to cover the area in the periphery of the lower chamber. Due to this operation deck, not only the replacement operations of the units are more easily performed but also a harmful influence due to powder dust generated from the evaporation sources to which the maintenance is performed outside the lower chamber through the evaporation source openings upon the film substrate can be suppressed or prevented. In general, the replacement operations of the feeding unit and the take-up unit and the maintenance operation of the evaporation sources are performed at the same time. At this time, dust is often adhered onto the evaporation sources throughout a long operational process. Thus, at the time of the unit replacement operations, due to the influence of the dust generation in accordance with the maintenance operation of the evaporation sources, the film substrate in the feeding unit or the take-up unit is contaminated, and there is a fear that the deposition quality is lowered. However, the operation deck divides an area in a periphery of the door sections for the substrate and an area in a periphery of the evaporation source door sections, so that the unit replacement operations can be performed in the area on the upper side where the cleanliness level is higher than the area on the lower side of the operation deck. Thus, the operation deck can contribute to improvement of the deposition quality.

Preferably, the continuous deposition apparatus according to the present invention further includes the heaters provided in the upper chamber, the heaters for heating the film substrate fed out from the feeding unit during the conveyance. This heaters can facilitate the removal of the gas component (mainly water vapor) adhered on the film substrate before the film substrate in the upper chamber is fed out from the feeding unit and conveyed to the lower chamber. Thereby, a gas amount discharged from the film substrate during deposition is reduced, so that the deposition quality can be improved.

More preferably, the continuous deposition apparatus according to the present invention further includes the atmosphere separating section connecting the upper chamber and the lower chamber, and this atmosphere separating section forms the conveyance passage in a shape of allowing the conveyance of the film substrate before the coating is deposited thereon from the inside of the upper chamber to the inside of the lower chamber and the conveyance of the film substrate after the coating is deposited thereon from the inside of the lower chamber to the inside of the upper chamber while separating the atmosphere between the upper chamber and the lower chamber. This atmosphere separating section suppresses the gas component generated at the time of feeding-out of the film substrate or the outgassing treatment from flowing from the upper chamber into the lower chamber while allowing the conveyance of the film substrate between the lower chamber and the upper chamber, so that the deposition quality in the lower chamber can be improved.

Favorably, the conveyance passage formed by the atmosphere separating section extends for example in the up and down direction, and the transverse section of the conveyance passage seen from the upper side has a smaller shape than the transverse sections in the upper chamber and the lower chamber.

More preferably, in addition to the atmosphere separating section, the continuous deposition apparatus of the present invention includes the sealing mechanism for shutting off the circulation of the atmosphere through the conveyance passage by overlapping the film substrates before and after the coating is deposited thereon in the conveyance passage formed by the atmosphere separating section while pressing the film substrates onto the inner peripheral surface surrounding the conveyance passage. Although the film substrates exist in the conveyance passage, this sealing mechanism can shut off the circulation of the atmosphere through the conveyance passage by effectively utilizing the film substrates. Due to this, even when the upper chamber is exposed to the outside air for the replacement operations of the feeding unit and the take-up unit before and after the deposition operation, the atmosphere in the lower chamber can be maintained at the reduced pressure. Thereby, the absorption of the gas in the outside air to the inner wall of the chamber due to the exposure of the inside of the lower chamber to the outside air can be suppressed or prevented, so that the deposition quality can be more stabilized. At the time of resuming the operation, the atmosphere in the lower chamber can be promptly restored to treatment atmosphere with minor exhaust for the inside of the lower chamber.

The atmosphere separating section may have the first atmosphere separating section forming the first conveyance passage for conveying the film substrate before the coating is deposited thereon from the upper chamber to the lower chamber, and the second atmosphere separating section forming the second conveyance passage for conveying the film substrate after the coating is deposited thereon from the lower chamber to the upper chamber independently from the first conveyance passage. In this case, further, the first sealing mechanism for shutting off the circulation of the atmosphere in the first conveyance passage in a state that the film substrate before the coating is deposited thereon is inserted into the first conveyance passage, and the second sealing mechanism for shutting off the circulation of the atmosphere in the second conveyance passage in a state that the film substrate after the coating is deposited thereon is inserted into the second conveyance passage may be provided.

The continuous deposition apparatus according to the present invention may further include the operation deck where the carrying operations of the feeding unit and the take-up unit are performed through the openings for the substrate, the openings for the substrate and the door sections for the substrate may be provided in the upper wall of the vacuum chamber, and the operation deck may be provided on the upper side of the evaporation source door sections so as to cover the area in the periphery of the vacuum chamber. Due to the operation deck provided in such a way, the feeding unit and the take-up unit can be hanged from the upper part of the vacuum chamber. Thereby, the unit replacement operations are easily performed. Since the door sections for the substrate are only provided in the upper wall part of the vacuum chamber, the apparatus structure is simple so as to be easily implemented. Due to the operation deck, the influence of the area in the periphery on the lower side of the vacuum chamber upon the upper side can be suppressed or prevented. Thereby, the deposition quality can be improved.

The invention claimed is:

1. A continuous deposition apparatus for depositing a coating made of a deposition material on a surface of a film substrate on which the coating is to be deposited, comprising:
    a vacuum chamber;
    a deposition roller provided in said vacuum chamber and rotatable about a horizontal axis, whereby the film substrate may be wound around the deposition roller with the width of the film substrate extending in the horizontal direction;
    an evaporation source of the deposition material for supplying and depositing the deposition material onto the film substrate wound around said deposition roller;
    a feeding unit rotatably arranged on the upper side of said deposition roller in said vacuum chamber, the feeding unit being provided for supplying the film substrate to said deposition roller; and
    a take-up unit rotatably arranged on the upper side of said deposition roller in said vacuum chamber, the take-up unit being provided for taking up the film substrate after the coating is deposited thereon,
    wherein said vacuum chamber has an evaporation source opening for carrying said evaporation source out of and into said vacuum chamber, an evaporation source door section for opening and closing the evaporation source opening, an opening for the film substrate provided at a separate position from the evaporation source opening, the opening for the substrate being provided for carrying said feeding unit and said take-up unit out of and into said vacuum chamber, and a door section for the substrate provided separately from the evaporation source door section, the door section for the substrate being provided for opening and closing the opening for the substrate,
    wherein said vacuum chamber is formed by an upper chamber having a bottom wall and containing therein said feeding unit and said take-up unit, and a lower chamber having a top wall and containing therein said deposition roller and said evaporation source,
    wherein said bottom wall of the upper chamber and said top wall of the lower chamber are different walls that are separated from each other,
    wherein said opening for the substrate and said door section for the substrate are provided in said upper chamber, and said evaporation source opening and said evaporation source door section are provided in said lower chamber,
    further comprising:
    an atmosphere separating section extending between said bottom wall of the upper chamber and said top wall of the lower chamber, and connecting said upper chamber and said lower chamber, wherein
    said atmosphere separating section forms a conveyance passage in a shape allowing conveyance of the film substrate before the coating is deposited thereon from the inside of said upper chamber to the inside of said lower chamber and conveyance of the film substrate after the coating is deposited thereon from the inside of said lower chamber to the inside of said upper chamber while separating the atmosphere between said upper chamber and said lower chamber.

2. The continuous deposition apparatus according to claim 1, further comprising:
    an operation deck where carrying operations of said feeding unit and said take-up unit are performed through said opening for the substrate, wherein
    said operation deck is provided on the upper side of said evaporation source door section so as to cover an area in a periphery of said lower chamber.

3. The continuous deposition apparatus according to claim 1, further comprising:
    a heater provided in said upper chamber, the heater for heating the film substrate fed out from said feeding unit during conveyance.

4. The continuous deposition apparatus according to claim 1, wherein
    said conveyance passage formed by said atmosphere separating section extends in the up and down direction, and
    a transverse section of said conveyance passage seen from the upper side has a smaller shape than transverse sections in said upper chamber and said lower chamber.

5. The continuous deposition apparatus according to claim 4, further comprising:
    a sealing mechanism for shutting off the circulation of the atmosphere through said conveyance passage by overlapping the film substrates before and after the coating is deposited thereon in said conveyance passage formed by said atmosphere separating section while pressing the film substrates onto an inner peripheral surface surrounding said conveyance passage.

6. The continuous deposition apparatus according to claim 1, wherein
    said atmosphere separating section has a first atmosphere separating section forming a first conveyance passage for conveying the film substrate before the coating is deposited thereon from said upper chamber to said lower chamber, and a second atmosphere separating section forming a second conveyance passage for conveying the film substrate after the coating is deposited thereon from said lower chamber to said upper chamber independently from the first conveyance passage.

7. The continuous deposition apparatus according to claim 1, further comprising:
    an operation deck where carrying operations of said feeding unit and said take-up unit are performed through said opening for the substrate, wherein
    said opening for the substrate and said door section for the substrate are provided in an upper wall of said vacuum chamber, and said operation deck is provided on the upper side of said evaporation source door section so as to cover an area in a periphery of said vacuum chamber.

* * * * *